(12) United States Patent
Goh et al.

(10) Patent No.: US 10,861,839 B2
(45) Date of Patent: Dec. 8, 2020

(54) DYNAMIC RANDOM ACCESS MEMORY (DRAM) MOUNTS

(71) Applicant: Intel Corporation, Santa Clara, CA (US)

(72) Inventors: Eng Huat Goh, Penang (MY); Hoay Tien Teoh, Paya Terubong (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/531,688

(22) Filed: Aug. 5, 2019

(65) Prior Publication Data

US 2020/0027867 A1    Jan. 23, 2020

Related U.S. Application Data

(63) Continuation of application No. 15/781,798, filed as application No. PCT/US2015/065949 on Dec. 16, 2015, now Pat. No. 10,411,001.

(51) Int. Cl.
*H01L 25/18* (2006.01)
*H01L 23/48* (2006.01)
(Continued)

(52) U.S. Cl.
CPC .......... *H01L 25/18* (2013.01); *H01L 21/4882* (2013.01); *H01L 23/13* (2013.01); *H01L 23/36* (2013.01); *H01L 23/3675* (2013.01); *H01L 23/48* (2013.01); *H01L 23/5385* (2013.01); *H01L 23/5386* (2013.01); *H01L 24/16* (2013.01); *H01L 25/0652* (2013.01); *H01L 25/0655* (2013.01); *H01L 25/0657* (2013.01); *H01L 25/105* (2013.01); *H01L 24/13* (2013.01);
(Continued)

(58) Field of Classification Search
CPC . H01L 25/18; H01L 25/0652; H01L 25/0655; H01L 25/0657; H01L 25/105; H01L 25/50; H01L 21/4882; H01L 23/3675; H01L 23/48; H01L 23/5386; H01L 24/16; H01L 24/13
USPC ......................................................... 257/793
See application file for complete search history.

(56) References Cited

U.S. PATENT DOCUMENTS 10,411,001 B2 * 9/2019 Goh ........................ H01L 25/18
2004/0195667 A1 * 10/2004 Karnezos ............ H01L 23/3135
257/686

(Continued)

FOREIGN PATENT DOCUMENTS

| JP | 2003100942 A | 4/2003 |
| TW | 201733050 A | 9/2017 |
| WO | WO-2017105421 A1 | 6/2017 |

OTHER PUBLICATIONS

U.S. Appl. No. 15/781,798 U.S. Pat. No. 10,441,001, filed Jun. 6, 2018, Dynamic Random Access Memory (DRAM) Mounts.

(Continued)

*Primary Examiner* — Tong-Ho Kim
(74) *Attorney, Agent, or Firm* — Schwegman Lundberg & Woessner, P.A.

(57) ABSTRACT

Donut-shaped Dynamic Random Access Memory (DRAM) includes a hole that fits around a processor, such that the DRAM and the processor are adjacent to one another on an Integrated Circuit (IC) package. In an embodiment, a heat spreader is mounted on top of the processor and covers a top of the DRAM without touching the DRAM.

12 Claims, 9 Drawing Sheets

(51) Int. Cl.
  *H01L 25/065* (2006.01)
  *H01L 25/10* (2006.01)
  *H01L 23/13* (2006.01)
  *H01L 23/538* (2006.01)
  *H01L 23/36* (2006.01)
  *H01L 23/00* (2006.01)
  *H01L 21/48* (2006.01)
  *H01L 23/367* (2006.01)
  *H01L 25/00* (2006.01)

(52) U.S. Cl.
  CPC .............. *H01L 24/32* (2013.01); *H01L 24/48* (2013.01); *H01L 24/73* (2013.01); *H01L 25/50* (2013.01); *H01L 2224/131* (2013.01); *H01L 2224/16225* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2225/0651* (2013.01); *H01L 2225/06568* (2013.01); *H01L 2225/1023* (2013.01); *H01L 2225/1058* (2013.01); *H01L 2225/1076* (2013.01); *H01L 2225/1088* (2013.01); *H01L 2225/1094* (2013.01); *H01L 2924/00014* (2013.01); *H01L 2924/1431* (2013.01); *H01L 2924/1434* (2013.01); *H01L 2924/1436* (2013.01); *H01L 2924/15151* (2013.01); *H01L 2924/15311* (2013.01); *H01L 2924/15331* (2013.01); *H01L 2924/16251* (2013.01); *H01L 2924/181* (2013.01); *H01L 2924/1815* (2013.01); *H01L 2924/19041* (2013.01)

(56) References Cited

U.S. PATENT DOCUMENTS

| | | |
|---|---|---|
| 2008/0227238 A1 | 9/2008 | Ko et al. |
| 2009/0244807 A1 | 10/2009 | Lee et al. |
| 2015/0076687 A1 | 3/2015 | Sutardja |
| 2015/0340303 A1 | 11/2015 | Oh et al. |
| 2018/0366457 A1 | 12/2018 | Goh et al. |

OTHER PUBLICATIONS

"U.S. Appl. No. 15/781,798, Non Final Office Action dated Jan. 11, 2019", 15 pgs.

"U.S. Appl. No. 15/781,798, Notice of Allowance dated Apr. 29, 2019", 10 pgs.

"U.S. Appl. No. 15/781,798, Response filed Apr. 11, 2019 to Non Final Office Action dated Jan. 11, 2019", 8 pgs.

"International Application Serial No. PCT/US2015/065949, International Search Report dated Aug. 19, 2016", 6 pgs.

"International Application Serial No. PCT/US2015/065949, Written Opinion dated Aug. 19, 2016", 10 pgs.

"Taiwanese Application Serial No. 105134776, Office Action dated Dec. 30, 2019", w English Translation of search report, 9 pgs.

"Taiwanese Application Serial No. 105134776, Response filed Feb. 12, 2020 to Office Action dated Dec. 30, 2019", w English claims, 48 pgs.

* cited by examiner

DYNAMIC RANDOM ACCESS MEMORY (DRAM) MOUNTS

This application is a continuation of U.S. patent application Ser. No. 15/781,798, filed Jun. 6, 2018, which is a U.S. National Stage Filing under 35 U.S.C. 371 from International Application No. PCT/US2015/065949, filed Dec. 16, 2015 and published in English as WO 2017/105421 on Jun. 22, 2017, each of which is incorporated herein by reference in its entirety.

TECHNICAL FIELD

Embodiments described herein generally relate to electrical interconnections in microelectronic devices.

BACKGROUND

Microelectronic devices such as IC (integrated circuit) packages may contain Z-values (thickness values) based on the memory mounted on top of the Silicon/System on Chip (SOC). The memory mounted on top of a heat spreader, which affects thermal performance of the IC because as the SOC processes heat rises to the heat spreader, which sits under the memory. So current designs for microelectronic devices having ICs are restricted in terms of how thin such devices are capable of being because of the combined thickness of the SOC and the memory. Moreover, such microelectronic devices have thermal heat restrictions because the memory mounts on top of the SOC of the IC, which blocks heat dissipating (even with the heat spreader) and unduly heats the SOC during operation of the IC.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
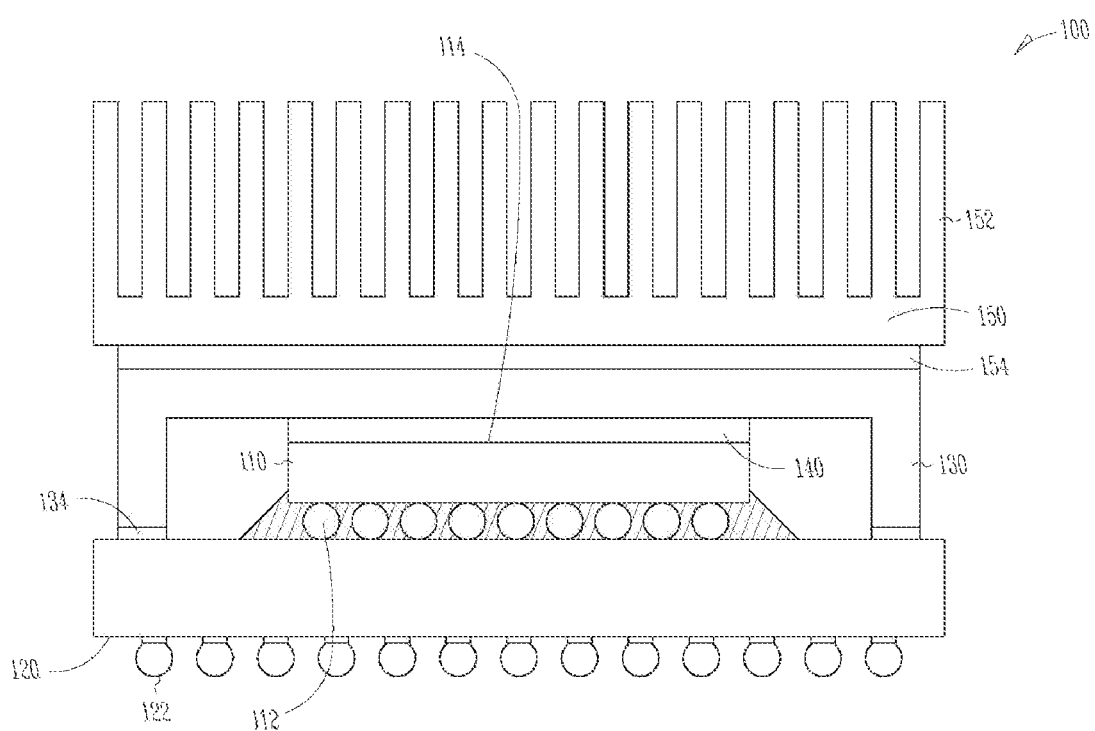
FIG. 1 is a cross section view of an IC package in accordance with some embodiments of the invention.

FIG. 1 is a cross section view of an IC package 100 in accordance with some embodiments of the invention. In embodiments where the IC die is a processor die, the IC package 100 can be termed a processor assembly. IC package 100 includes an IC die 110 mounted in "flip-chip" orientation with its active side facing downward to couple with an upper surface of a substrate 120, through interconnections 112 such as solder balls or bumps. The substrate 120 also shows a second number of first level interconnections 122 on its opposite surface for mating with additional packaging structures such as boards (not shown).

Die 110 generates its heat from internal structure, including wiring traces, located near its active side; however, a significant portion of the heat dissipates through its backside 114. Heat that is concentrated within the die dissipates to a large surface that is in contact with the die in the form of an integrated heat spreader 130. A thermal interface material 140 situated between the die 110 and integrated heat spreader 130. In one embodiment, to dissipate heat from the integrated heat spreader 130, a heat sink 150 optionally having fins 152 coupled to the integrated heat spreader 130.

Figure 2:
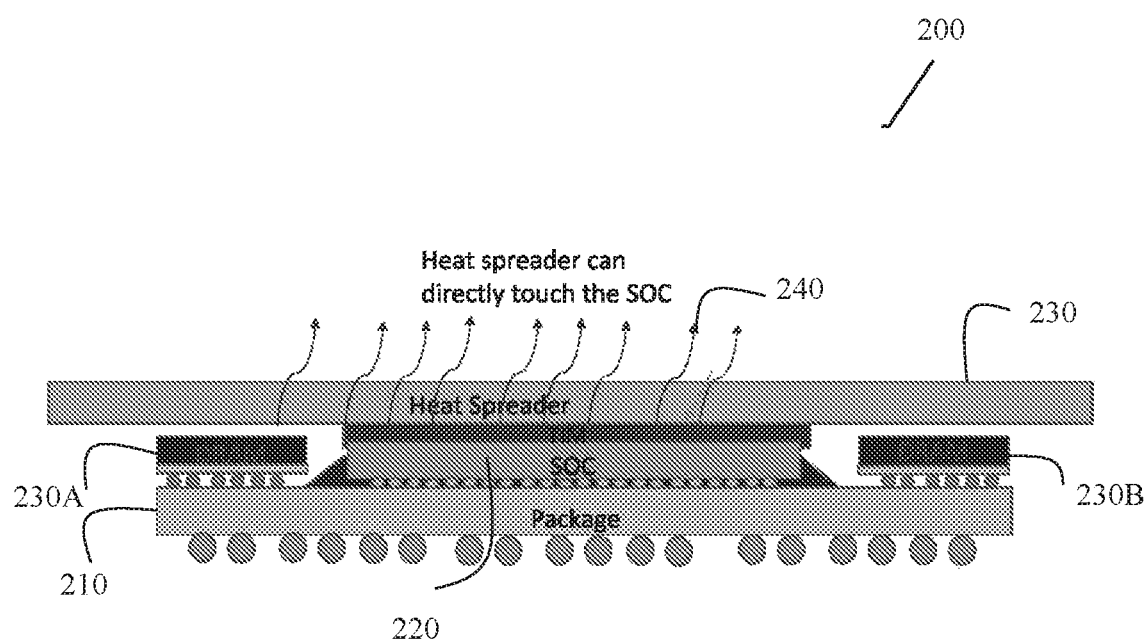
FIG. 2 shows a diagram where the SOC/processor exhibits good contact with a heat spreader having side-mounted RAM, according to some embodiments of the invention.

FIG. 2 shows a diagram where the Silicon/System on Chip (SOC—herein after "processor") 220 exhibits good contact with a heat spreader 230 having side-mounted DRAM 230A and 230B, according to some embodiments of the invention.

Currently, IC packages are limited to less than 2 Watts of Total Design Power (<2W TDP) while offering DRAM. The convention DRAM is placed on top of the processor or placed in the motherboard. Both of these approaches results in larger IC-footprint sizes.

The IC package 200 of the FIG. 2 demonstrates an ability to achieve thinner Z packages, since the DRAM 230A and 230B situates in parallel with the processor 220 (instead of a traditionally approach with DRAM situated on top of the processor).

In an embodiment, the DRAM 230A and/or 230B is much thicker (Z dimension) than the processor 220. As a result, the processor 220 can be much thicker to improve the assembly and test of the IC 200.

In an embodiment, the changes in the manner that DRAM is manufactured may cause IC expense to rise but once adoption occurs, the IC expense may reduce substantially.

Figure 3:
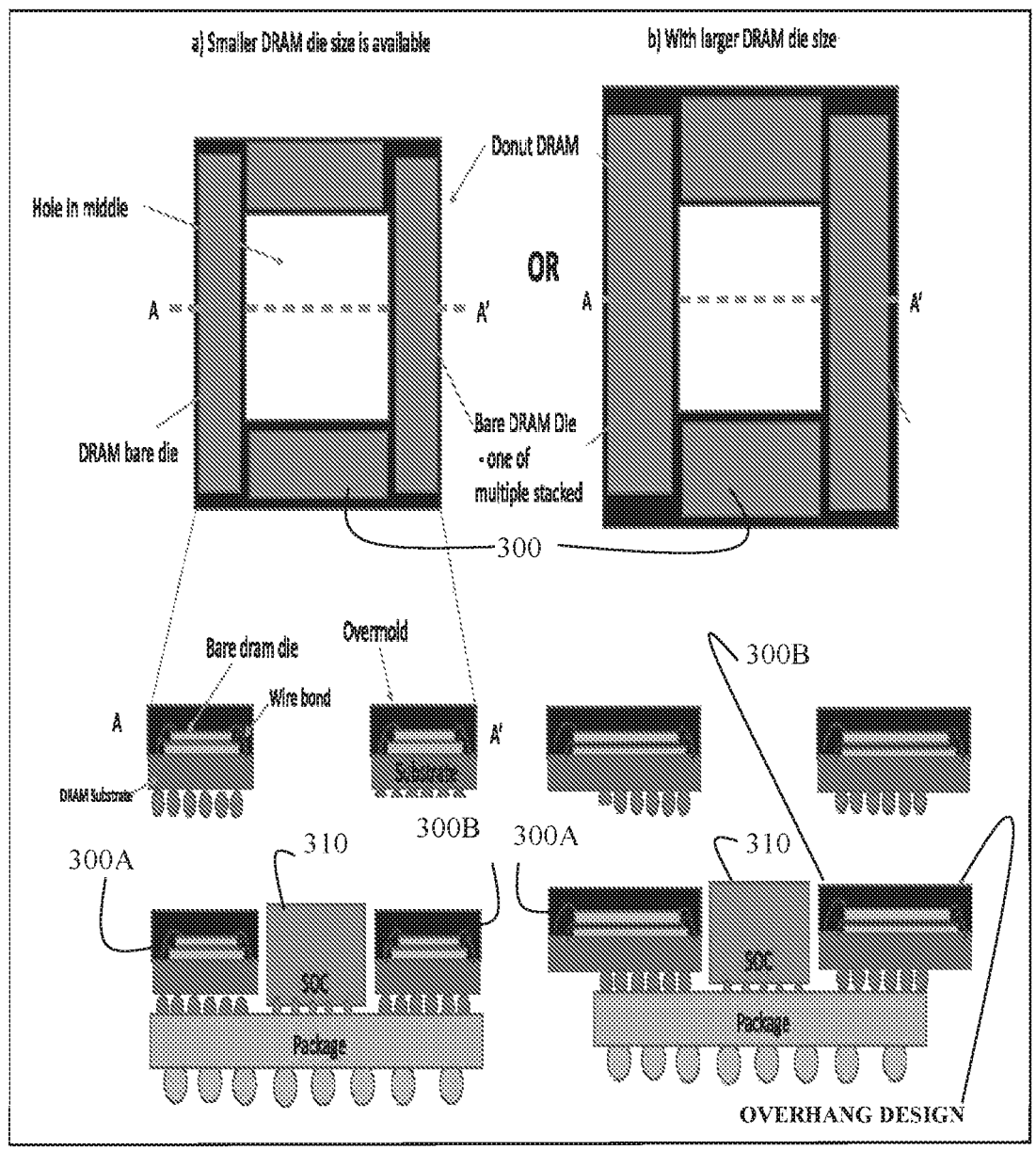
FIG. 3 shows diagrams of donut-shaped DRAM and DRAM side-mount stacking with some embodiments of the invention.

FIG. 3 shows diagrams of donut-shaped DRAM and DRAM side-mount stacking with some embodiments of the invention. The DRAM 300A and 300B is hollow in the middle, thus, exposing the processor 310 when placed on top of the processor package. That is, the DRAM 300 of FIG. 3 includes a hole that when placed over the processor 310 package creates a donut-DRAM 300.

In an embodiment, multiple ones of the donut-shaped DRAMS 300A and 300B placed on top of one another to form stacking as shown in the bottom figures of FIG. 3. This reduces the XY footprint of the integrated device having the IC package while at the same time reducing thickness of the IC package (Z dimension).

Figure 4:
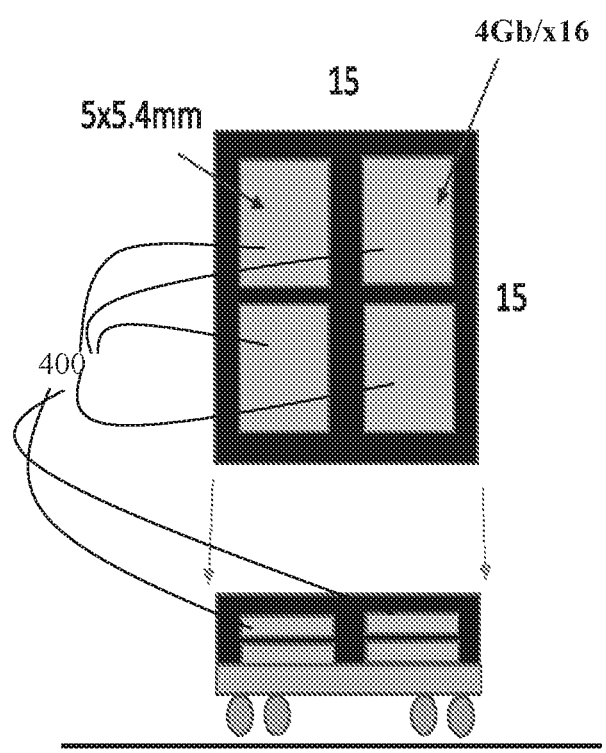
FIG. 4 shows diagrams for side-stacking DRAM mounting with some embodiments of the invention.

FIG. 4 shows diagrams for side-stacking DRAM mounting with some embodiments of the invention. The DRAM 400 is shown as 4 Gb/x16 sections with 5×5.4 mm dimensions. The DRAM 400 is stackable to form side-by-side placement with the processor on the IC package. This results in thinner IC packages and cooler running chips with better heat dissipation, since the DRAM 400 is no longer on top of the heat spreader and the processor.

In an embodiment, the FIG. 4 shows a 15×15 mm Samsung Low Power Double Data Rate (LPDDR4) POP (Package on Package) DRAM 400.

Figure 5:
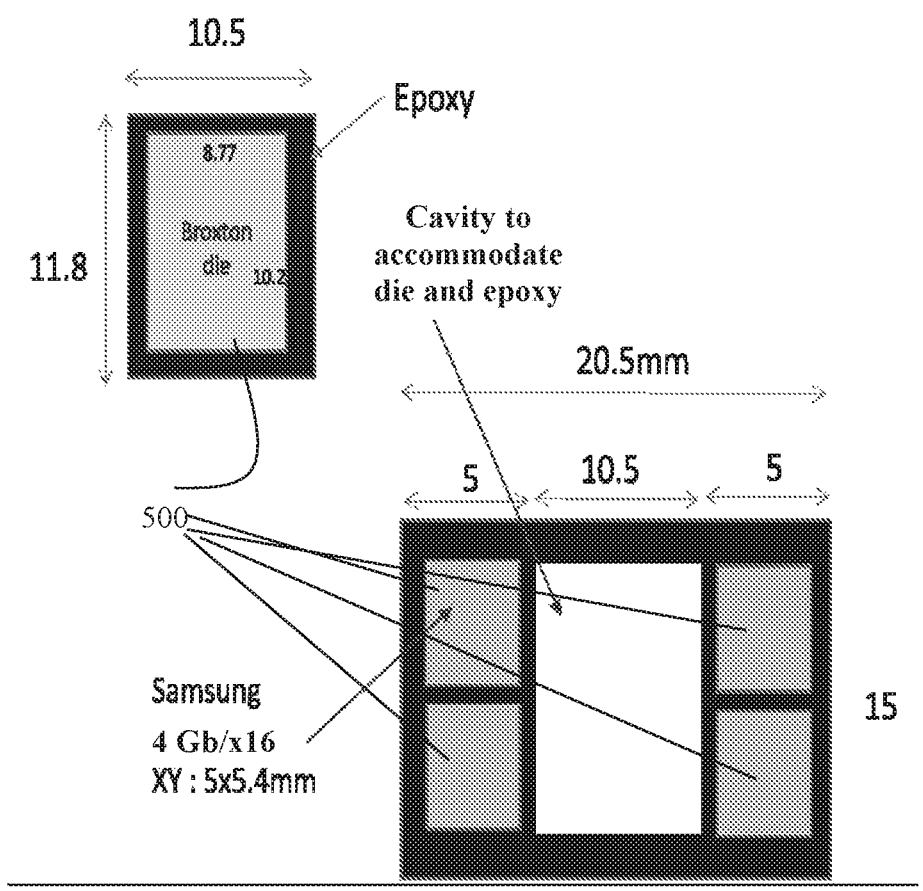
FIG. 5 is a diagram for sample dimensions of a donut-shaped DRAM with some embodiments of the invention.

FIG. 5 is a diagram for sample dimensions of a donut-shaped DRAM with some embodiments of the invention.

FIG. 5 shows the donut DRAM 500 with the existing 4 Gb/x16 bare die. In an embodiment, donut DRAM 500 may grow slightly larger from 15×15 mm to ~20.5×15 mm to accommodate larger dies when they are placed on top of the processor package.

The term "donut DRAM" includes DRAM that surrounds the processor layer on at least two sides. In an embodiment, the donut DRAM is stacked on top of one another.

In an embodiment, the FIGS. 4-5 illustrate case studies using selected POP & 4 Gb/x16 Low Power Double Data Rare (LPDDR4) Bare Die from Samsung to illustrate donut DRAM 500 stack mounting on the IC package.

Figure 6A:
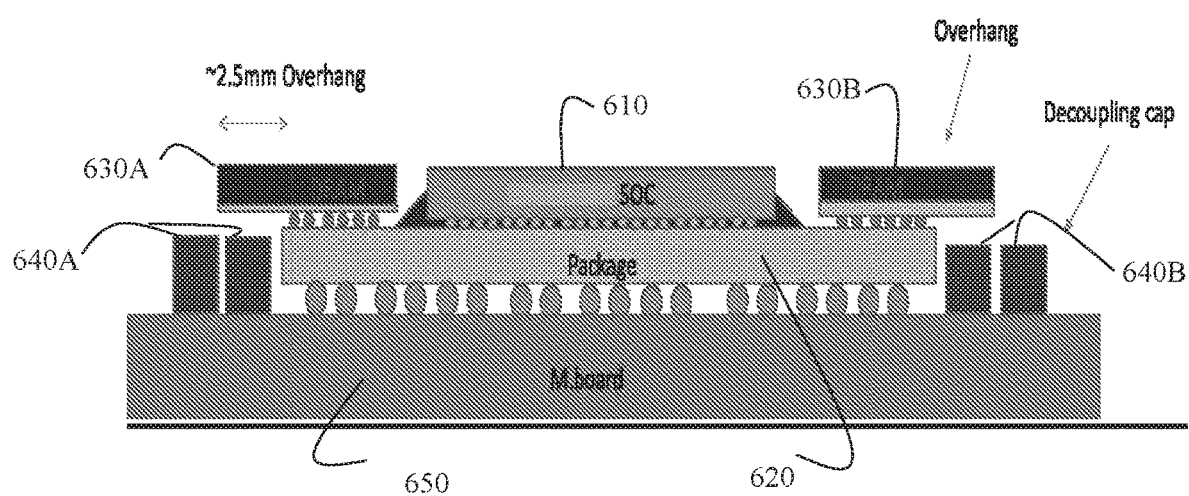
FIG. 6A is a diagram showing SOC/processor and donut-shaped DRAM mounted on the IC board with some embodiments of the invention.

FIG. 6A is a diagram showing a processor and a donut-shaped DRAM (630A and 630B) stack mounted on an IC board 650 with some embodiments of the invention.

The processor 610 is shown in the middle of (hole of) a donut-shaped DRAM 630A and 630B mounted on the board 650 through the package 620. The DRAM 630A and 630B overhangs a package 620 over the board 650. Additional devices, such as low profile decoupling capacitors 640A and 640B may be placed underneath the overhang area without any real estate wastage.

Figure 6B:
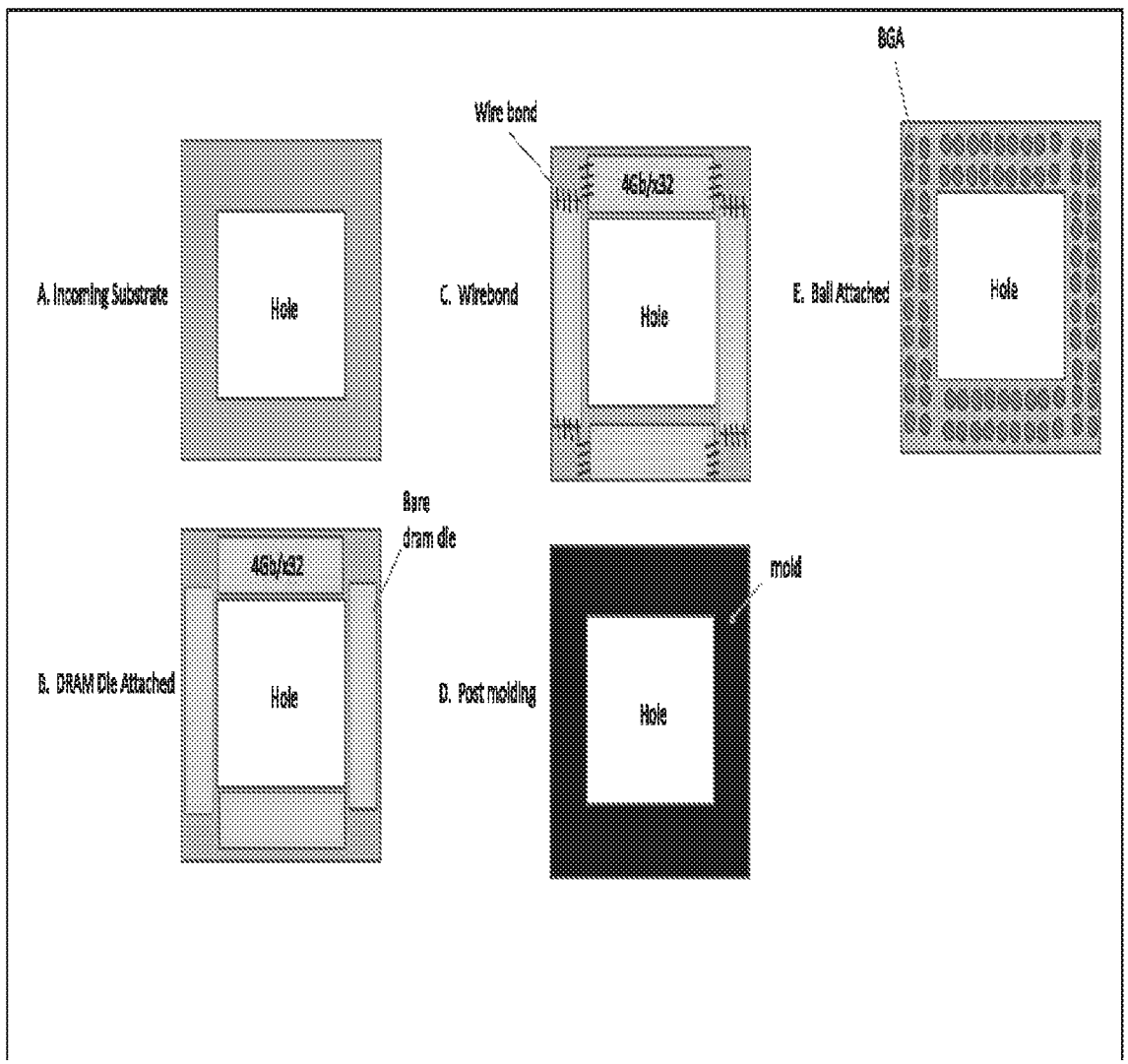
FIG. 6B is a diagram showing different donut-shaped DRAM fabrications with some embodiments of the invention.

FIG. 6B is a diagram showing different donut-shaped DRAM fabrications with some embodiments of the invention. FIG. 6B illustrates a variety of fabrications for the donut-shaped DRAM (A. incoming substrate; B. DRAM die attached; C. wire bond; D. post Molding; E. ball Attached).

Creation of donut-shaped DRAM mounting on the IC package around and/or parallel to the processor creates a smaller XY footprint and permits realization of thinner (Z) devices. The donut-shaped DRAM may also be stacked on top of itself to further reduce the XY footprint without loss of memory size.

Moreover, processor plus donut-shaped DRAM on IC packages provides improved heat dissipation from the processor.

In an embodiment, customization of the IC package is based on the device and its dimensions, such that the processor resides in a hole of the donut-shaped DRAM. This configuration exposes the chip in the middle of the hole. The IC package is thinner and processor heat dissipation improved over conventional IC packages.

Figure 7:
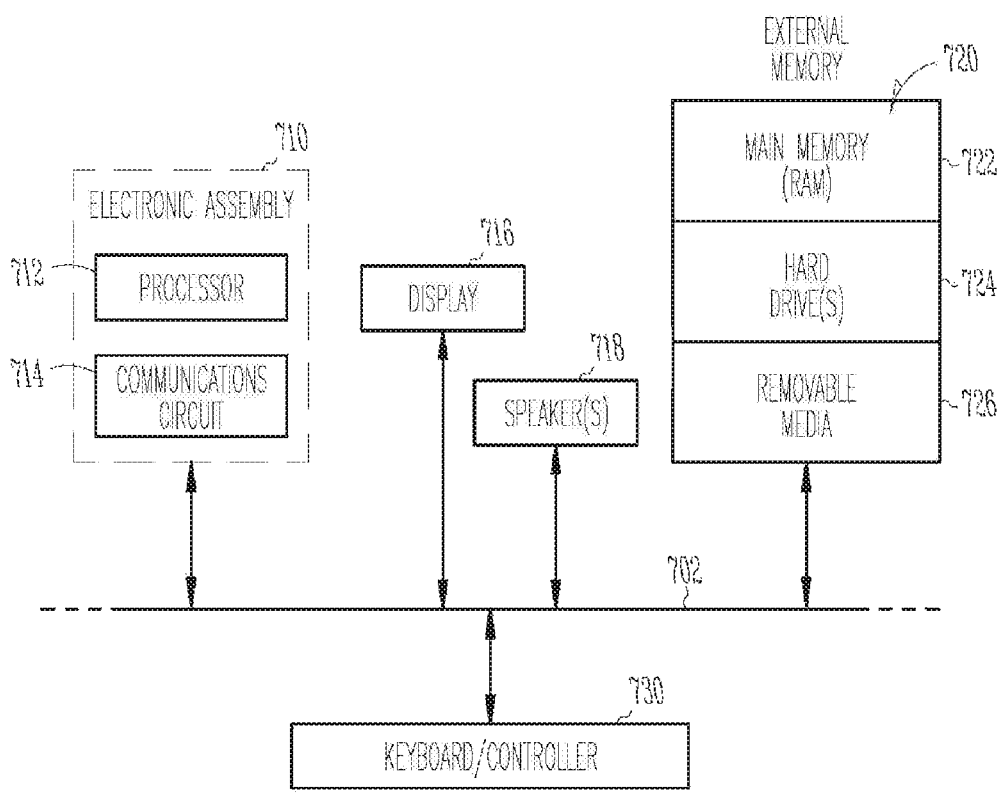
FIG. 7 is block diagram of an electronic system in accordance with some embodiments of the invention.

FIG. 7 is block diagram of an electronic system in accordance with some embodiments of the invention.

An example of an electronic device using donut-shaped DRAM assemblies and donut-shaped DRAM stacked assemblies as described in the present disclosure is included to show an example of a higher-level device application for the present invention. FIG. 7 is a block diagram of an electronic device 700 incorporating at least one donut-shaped DRAM IC method in accordance with at least one embodiment of the invention. Electronic device 700 is merely one example of an electronic system in which embodiments of the present invention used. Examples of electronic devices 700 include, but are not limited to personal computers, tablet computers, mobile telephones, game devices, MP3 or other digital music players, etc. In this example, electronic device 700 comprises a data processing system that includes a system bus 702 to couple the various components of the system. System bus 702 provides communications links among the various components of the electronic device 700 and implemented as a single bus, as a combination of buses, or in any other suitable manner.

An electronic assembly 710 coupled to system bus 702. The electronic assembly 710 can include any circuit or combination of circuits. In one embodiment, the electronic assembly 710 includes a processor 712, which can be of any type. A "processor" means any type of computational circuit, such as but not limited to a microprocessor, a microcontroller, a complex instruction set computing (CISC) microprocessor, a reduced-instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 710 are a custom circuit, an application-specific integrated circuit (ASIC), or the like, such as, for example, one or more circuits (such as a communications circuit 714) for use in wireless devices like mobile telephones, personal data assistants, portable computers, two-way radios, and similar electronic systems. The IC can perform any other type of function.

The electronic device 700 can also include an external memory 720, which in turn can include one or more memory elements suitable to the particular application, such as a main memory 722 in the form of random access memory (RAM), one or more hard drives 724, and/or one or more drives that handle removable media 726 such as compact disks (CD), flash memory cards, digital video disk (DVD), and the like.

The electronic device 700 can also include a display device 716, one or more speakers 718, and a keyboard and/or controller 730, which can include a mouse, trackball, touch screen, voice-recognition device, or any other device that permits a system user to input information into and receive information from the electronic device 700.

Figure 8:
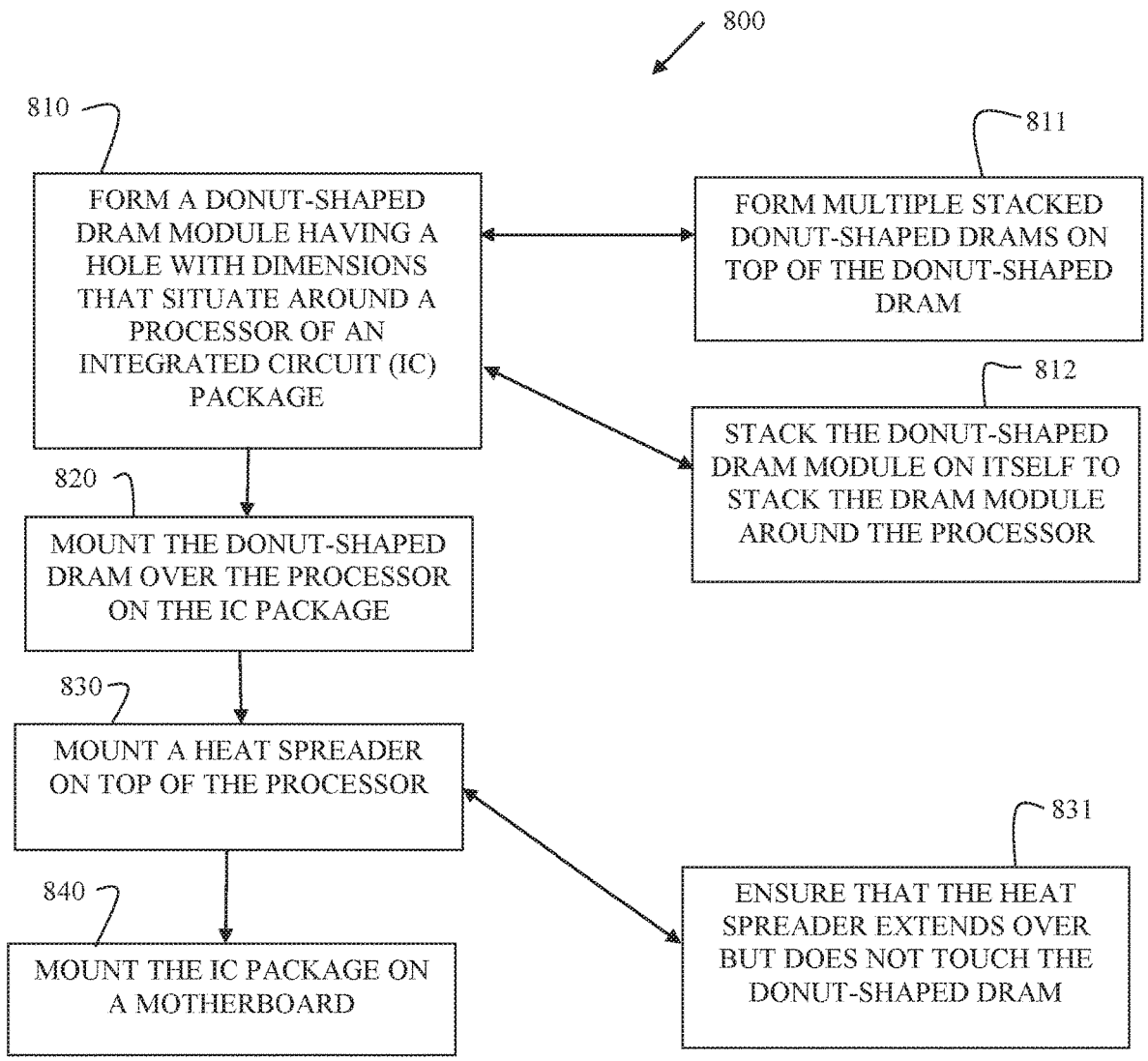
FIG. 8 is a diagram of a method for mounting and packaging DRAM with some embodiments of the invention.

FIG. 8 is a diagram of a method 800 for mounting and packaging DRAM with some embodiments of the invention. In an embodiment, the method 800 includes one or more portions implemented as executable instructions on a non-transitory computer-readable storage medium that when executed by a computer (such as a 3D printer and others) performs the processing depicted in the FIG. 8.

At 810, the processing forms a donut-shaped DRAM having a hole with dimensions that situate around a processor of an integrated circuit (IC) package.

In an embodiment, the processing, at 811, forms multiple stacked donut-shaped DRAMs on tip of the donut-shaped DRAM.

In an embodiment, the processing, at 812, configures dimensions for the hole to surround and fit over the processor.

At 820, the processing mounts the donut-shaped DRAM over the processor on the IC package.

According to an embodiment, at 830, the processing mounts a heat spreader on top of the processor.

In an embodiment of 830 and at 831, the processing ensures the heat spreader extends over but does not touch the donut-shaped DRAM.

In an embodiment of 830 and at 840, the processing mounts the IC package on a motherboard.

To better illustrate the method and apparatuses disclosed herein, a non-limiting list of embodiments is provided here:

Example 1 includes an integrated circuit package, including, a donut-shaped memory device mounted to a package board and a Silicon/System On Chip (SOC—"processor") mounted in a hole area of the donut-shaped memory device on the package board.

Example 2 includes the integrated circuit package of claim 1, wherein the donut-shaped memory device surrounds the hole area and when placed on the package board mounts on the package board adjacent and parallel to the processor.

Example 3 includes the integrated circuit package of any one of examples 1-2, wherein the donut-shaped memory device is adapted to be stacked with other donut-shaped memory devices on the package board.

Example 4 includes the integrated circuit package of any one of examples 1-3, wherein the portion of the donut-shaped memory device overhangs an end of the package board.

Example 5 includes the integrated circuit package of example 4, wherein the portion is situated above decoupling capacitors mounted on a motherboard of the integrated circuit.

Example 6 includes the integrated circuit package of any one of examples 1-5 further comprising a motherboard to which the package board is mounted.

Example 7 includes the integrated circuit package of example 6, further including distribution capacitors mounted on the motherboard and under a portion of the donut-shaped memory device.

Example 8 includes the integrated circuit package of any one of examples 1-7 further including a plurality of other donut-shaped memory devices, the other donut-shaped memory devices stacked and mounted on top of one another and the donut-shaped memory device.

Example 9 includes a method, including forming a donut-shaped dynamic random access memory module (DRAM) having a hole with dimensions that situated around a processor of an Integrated Circuit (IC) package, and mounting the donut-shaped DRAM over the processor on the IC package.

Example 10 includes the method of example 9 further including mounting a heat spreader on top of the processor.

Example 11 includes the Example 10 further including mounting the IC package on a motherboard.

Example 12 includes the method of Example 10 further including mounting the heat spreader for ensuring the heat spreader extends over but does not touch the donut-shaped DRAM.

Example 13 includes the method of any one of examples 9-12, wherein forming further includes forming multiple stacked donut-shaped DRAMs on top of the donut-shaped DRAM.

Example 14 includes the method of any of examples 9-13, wherein forming further includes folding or stacking the donut-shaped DRAM module on itself to stack the donut-shaped DRAM module around the processor.

Example 15 includes an apparatus including a donut-shaped DRAM configured with a hole in its center, and a processor configured to fit within the hope of the DRAM.

Example 16 includes the apparatus of example 15 further including a packaging board configured to mount the processor and the donut-shaped DRAM.

Example 17 includes the apparatus of the example 16 further including a motherboard configured to mount the packaging board.

Example 18 includes the apparatus of example 17 further including an integrated device having the apparatus.

Example 19 includes the apparatus of any of the examples 15-18 further including a plurality of other donut-shaped DRAMs mounted on top of one another and the donut-shaped DRAM.

Example 20 includes the apparatus of any of the examples 15-19 further including a heat spreader mounted on top of the processor and covers a top of the donut-shaped DRAM without touching the donut-shaped DRAM.

These and other examples and features of the present donut-DRAM systems, and related methods will be set forth in part in the following detailed description. This overview intended to provide non-limiting examples of the present subject matter—and not intended to provide an exclusive or exhaustive explanation. The detailed description below is included to provide further information about the present donut-shaped DRAMs IC packages, methods, and apparatuses.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method, comprising:
   mounting a first donut-shaped Dynamic Random-Access Memory (DRAM) on a packaging board of a processor assembly on a first side of the packaging board;
   mounting a second donut-shaped DRAM on the packaging board of the processor assembly on a second side of the packaging board; and
   mounting a processor in parallel with the first donut-shaped DRAM and the second donut-shaped DRAM on the packaging board and between the first donut-shaped DRAM and the second donut-shaped DRAM.

2. The method of claim 1 further comprising stacking at least one additional first donut-shaped DRAM on top of the first donut-shaped DRAM.

3. The method of claim 2 further comprising, stacking at least one additional second donut-shaped DRAM on top of the second donut-shaped DRAM.

4. The method of claim 1, wherein mounting the first donut-shaped DRAM further includes mounting the first donut-shaped DRAM with a first overhang that extends a first outer edge of the first donut-shaped DRAM beyond a first end of the packaging board along the first side.

5. The method of claim 4, wherein mounting the second donut-shaped DRAM further includes mounting the second donut-shaped DRAM with a second overhang that extends a second outer edge of the second donut-shaped DRAM beyond a second end of the packaging board along the second side.

6. The method of claim 5 further comprising:
   mounting first decoupling capacitors on a first board side of a motherboard;
   mounting second decoupling capacitors on a second board side of the motherboard; and
   mounting the packaging board to the motherboard between the first decoupling capacitors and the second decoupling capacitors with the first decoupling capacitors situated beneath the first overhang of the first donut-shaped DRAM and with the second decoupling capacitors situated beneath the second overhang of the second donut-shaped DRAM.

7. An apparatus, comprising:
   a first donut-shaped Dynamic Random-Access Memory (DRAM) situated on a first side of a packaging board associated with a processor assembly;
   a second donut-shaped DRAM situated on a second side of the packaging board; and
   a processor mounted between the first donut-shaped DRAM and the second donut-shaped DRAM and in parallel to the first donut-shaped DRAM and the second donut-shaped DRAM on the packaging board.

8. The apparatus of claim 7 further comprising, at least one additional first donut-shaped DRAM stacked on top of the first donut-shaped DRAM to form a first stack of donut-shaped DRAMs having a first height on the packaging board.

9. The apparatus of claim 8 further comprising, at least one additional second donut-shaped DRAM stacked on top of the second donut-shaped DRAM to form a second stack of donut-shaped DRAMs having a second height on the packaging board.

10. The apparatus of claim 9, wherein a processor height associated with the processor is greater than both the first height of the first stack of donut-shaped DRAMs and the second height of the second stack of donut-shaped DRAMs.

11. The apparatus of claim 7, wherein the first donut-shaped DRAM includes a first overhang that extends beyond a first end of the packaging board along the first side, and wherein the second donut-shaped DRAM includes a second overhang that extends beyond a second end of the packaging board along the second side.

12. The apparatus of claim 7, wherein the packaging board is configured to be mounted to a motherboard with first decoupling capacitors situated under the first overhang, and wherein the packaging board is configured to be mounted to the motherboard with second decoupling capacitors situated under the second overhang.

* * * * *